(12) United States Patent
Mauder et al.

(10) Patent No.: US 11,018,249 B2
(45) Date of Patent: May 25, 2021

(54) SEMICONDUCTOR COMPONENT WITH EDGE TERMINATION REGION

(71) Applicant: Infineon Technologies AG, Neubiberg (DE)

(72) Inventors: Anton Mauder, Kolbermoor (DE); Hans-Joachim Schulze, Taufkirchen (DE); Matteo Dainese, Villach (AT); Elmar Falck, Hohenbrunn (DE); Franz-Josef Niedernostheide, Hagen a. T.W. (DE); Manfred Pfaffenlehner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/263,244

(22) Filed: Jan. 31, 2019

(65) Prior Publication Data
US 2019/0237575 A1    Aug. 1, 2019

(30) Foreign Application Priority Data

Feb. 1, 2018 (DE) .......................... 102018102279.4

(51) Int. Cl.
*H01L 29/78*    (2006.01)
*H01L 29/06*    (2006.01)
(Continued)

(52) U.S. Cl.
CPC ...... *H01L 29/7811* (2013.01); *H01L 29/0619* (2013.01); *H01L 29/1095* (2013.01); *H01L 29/402* (2013.01)

(58) Field of Classification Search
CPC ... H01L 29/7811; H01L 29/0615–0626; H01L 29/0638; H01L 29/0607
See application file for complete search history.

(56) References Cited

U.S. PATENT DOCUMENTS

| 4,374,389 A | 2/1983 | Temple |
| 8,264,047 B2 | 9/2012 | Schmidt |
(Continued)

FOREIGN PATENT DOCUMENTS

| DE | 10057612 A1 | 5/2002 |
| DE | 102004037153 A1 | 3/2006 |
(Continued)

OTHER PUBLICATIONS

Schmidt, Gerhard, et al., "Vertikaler Randabschluss mit drainseitiger Feldplatte", Siemens AG, 2005, pp. 1-7.

*Primary Examiner* — Alia Sabur
(74) *Attorney, Agent, or Firm* — Murphy, Bilak & Homiller, PLLC

(57) ABSTRACT

A semiconductor component includes a semiconductor body having opposing first surface and second surfaces, and a side surface surrounding the semiconductor body. The semiconductor component also includes an active region including a first semiconductor region of a first conductivity type, which is electrically contacted via the first surface, and a second semiconductor region of a second conductivity type, which is electrically contacted via the second surface. The semiconductor component further includes an edge termination region arranged in a lateral direction between the first semiconductor region of the active region and the side surface, and includes a first edge termination structure and a second edge termination structure. The second edge termination structure is arranged in the lateral direction between the first edge termination structure and the side surface and extends from the first surface in a vertical direction more deeply into the semiconductor body than the first edge termination structure.

19 Claims, 7 Drawing Sheets

(51) Int. Cl.
   *H01L 29/10*     (2006.01)
   *H01L 29/40*     (2006.01)

(56) References Cited

U.S. PATENT DOCUMENTS

| | | |
|---|---|---|
| 9,178,013 B2 | 11/2015 | Schmidt |
| 9,570,542 B2 | 2/2017 | Breymesser et al. |
| 2006/0267091 A1 | 11/2006 | Takahashi |
| 2010/0078775 A1* | 4/2010 | Mauder ............... H01L 29/0878 257/655 |
| 2014/0167143 A1 | 6/2014 | Schmidt |
| 2014/0167209 A1 | 6/2014 | Meiser et al. |
| 2014/0197422 A1* | 7/2014 | Wada ................. H01L 29/6606 257/77 |
| 2014/0246697 A1* | 9/2014 | Schulze ............. H01L 29/0878 257/192 |
| 2016/0027866 A1* | 1/2016 | Yoshikawa ......... H01L 29/0623 257/484 |
| 2016/0336396 A1* | 11/2016 | Konrath ................. H01L 22/34 |
| 2017/0271439 A1* | 9/2017 | Katano ............ H01L 21/67115 |
| 2017/0294526 A1 | 10/2017 | Storasta et al. |

FOREIGN PATENT DOCUMENTS

| | | |
|---|---|---|
| DE | 10240107 B4 | 3/2008 |
| DE | 102007030755 B3 | 2/2009 |
| DE | 102009031316 A1 | 3/2010 |
| DE | 102009036930 A1 | 3/2010 |
| DE | 102015121100 A1 | 6/2017 |

* cited by examiner

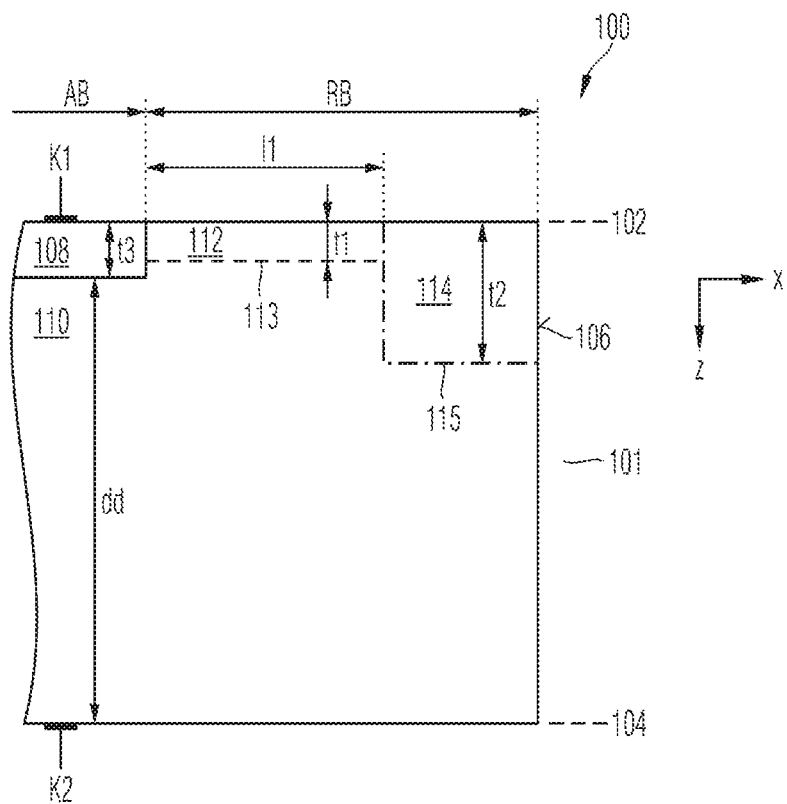
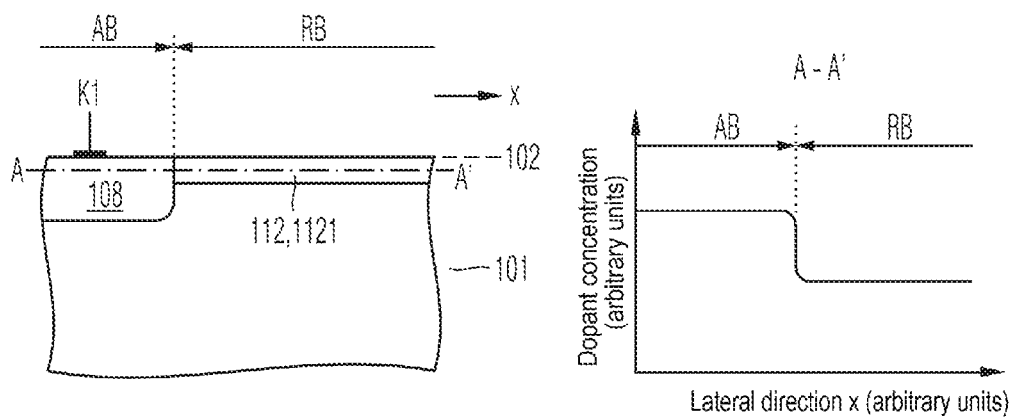

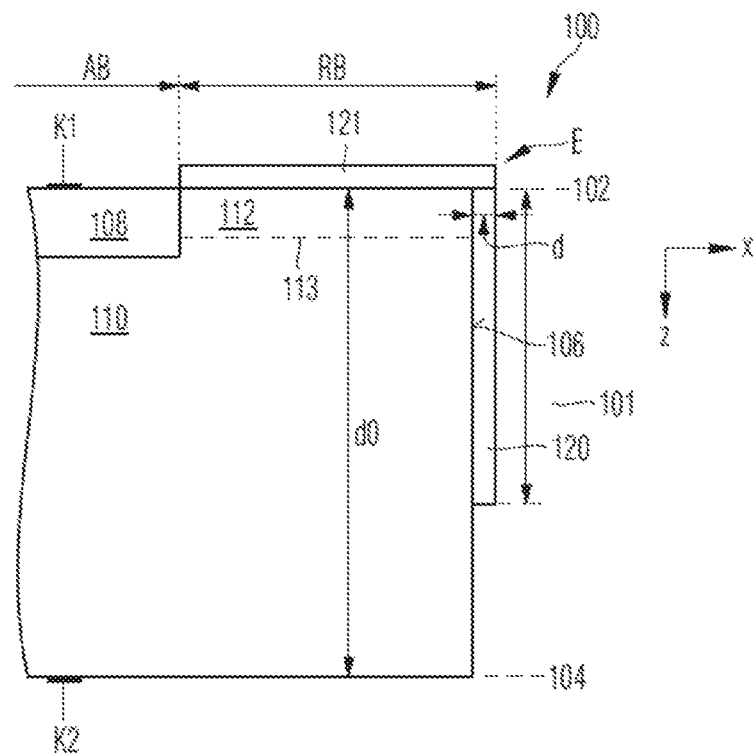
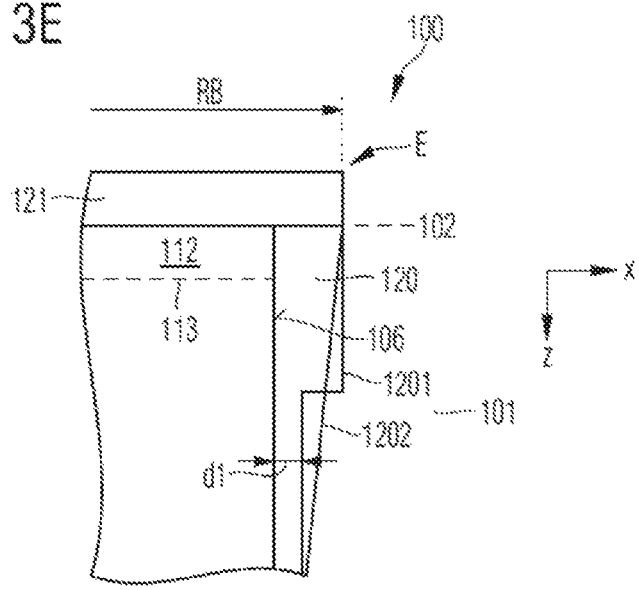

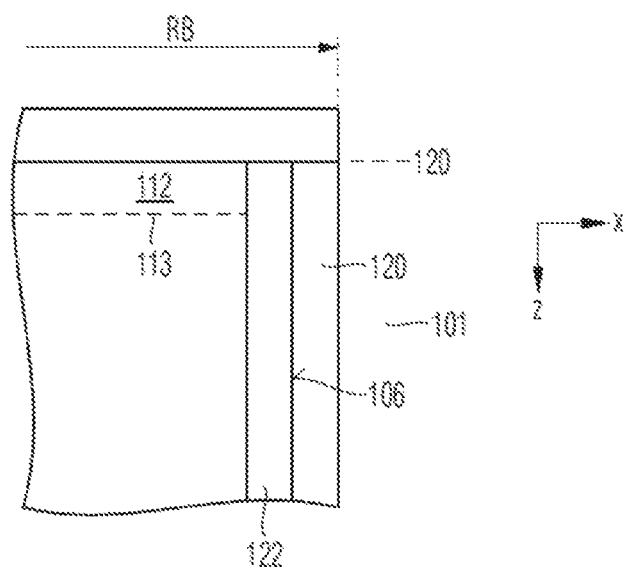
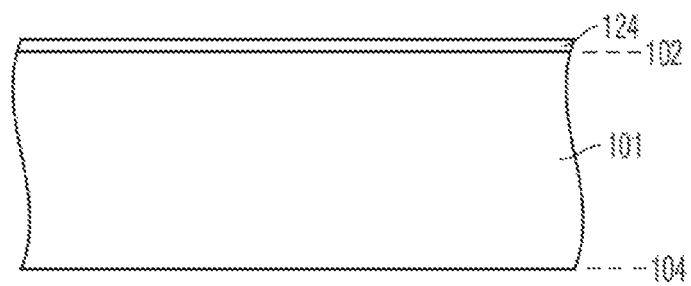
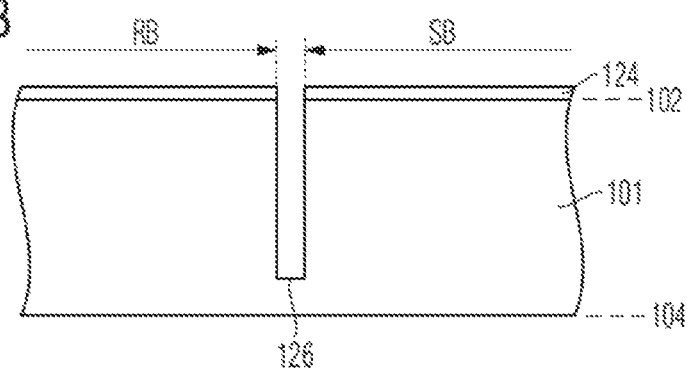

SEMICONDUCTOR COMPONENT WITH EDGE TERMINATION REGION

TECHNICAL FIELD

The application is devoted to semiconductor components comprising an edge termination region.

BACKGROUND

In semiconductor components having requirements in respect of the voltage blocking strength, the edge termination constitutes a key component part with regard to costs and reliability. On the one hand, the area requirement of the edge termination is intended to be as small as possible in order to allow cost-effective fabrication. On the other hand, the edge termination is intended to be well defined in order that the component does not undergo uncontrolled premature breakdown in the edge region when a reverse voltage is applied. Furthermore, the edge termination is intended to have a stability in stress tests under moisture and with high voltage present and also be robust vis-à-vis external positive as well as negative charges that may deposit—whether owing to production or in the course of operation—for example on a passivation layer applied on the semiconductor surface.

Semiconductor components having an improved edge termination region are thus desirable.

SUMMARY

The present disclosure relates to a semiconductor component comprising a semiconductor body having a first surface, a second surface opposite the first surface, and a side surface surrounding the semiconductor body. The semiconductor component additionally comprises an active region comprising a first semiconductor region of a first conductivity type, which is electrically contacted via the first surface, and a second semiconductor region of a second conductivity type, which is electrically contacted via the second surface. The semiconductor component additionally comprises an edge termination region, which is arranged in a lateral direction between the first semiconductor region of the active region and the side surface and comprises a first edge termination structure and a second edge termination structure, wherein the second edge termination structure is arranged in the lateral direction between the first edge termination structure and the side surface and extends from the first surface in a vertical direction more deeply into the semiconductor body than the first edge termination structure.

The first semiconductor region can be for example a body region of a field effect transistor (FET) or insulated gate bipolar transistor (IGBT) or else an anode or cathode region of a diode or of a thyristor. The second semiconductor region can be for example a drift zone of a FET or of an IGBT or else a cathode or anode region, respectively, of a diode or of a thyristor. The semiconductor component is for example a power semiconductor component suitable for conducting currents of greater than 1 A or else suitable for blocking voltages in the range of a few hundred to a few thousand volts, e.g. 650 V, 1.2 kV, 1.7 kV, 3.3 kV, 4.5 kV, 5.5 kV, 6 kV, 6.5 kV. The reverse voltage can correspond for example to the voltage class of the component as specified in the data sheet.

The subdivision of the edge termination region into a first edge termination structure and into a second edge termination structure, which lies further outward with respect to the first edge termination structure and which additionally extends into the semiconductor body more deeply than the first edge termination structure, enables a technically advantageous edge termination. The first edge termination structure makes it possible to achieve advantages with regard to reliability, e.g. on account of metal field plates not being necessary, which entail the risk of corrosion under the influence of moisture. The second edge termination structure enables advantages with regard to a reduced space requirement. The combination of the first and second edge termination structures additionally makes it possible to reduce the electric field strength in an insulator surrounding the semiconductor body, e.g. a polymer-based insulator such as a silicone potting compound or a molding compound and thus to prevent a failure in reliability tests such as a stress test under moisture, e.g. an HV-H3TRB (High Voltage, High Humidity, High Temperature reverse biased) test. The first edge termination structure is for example different from a body region of a FET or of an IGBT.

In accordance with one embodiment, the second edge termination structure comprises a dielectric, which adjoins the first side surface and extends along the vertical direction from at least one part of the side surface. The dielectric at the side surface serves for electric field reduction in the surrounding insulator and enables a space-saving design of the edge termination region.

In accordance with one embodiment, a thickness of the dielectric at the first surface lies in a range of 100 nm to 10 μm. The thickness can be dimensioned for example taking account of the voltage differences occurring between first and second surfaces.

In accordance with one embodiment, the dielectric extends at the side surface along the vertical direction from the first surface as far as at least one third of a thickness of the semiconductor body. The extension can be dimensioned for example taking account of the voltage drop between a specific depth of the semiconductor body and the second surface.

The thickness of the semiconductor body, more precisely the electrically active thickness or effective thickness of the semiconductor body, is defined herein by that region of the semiconductor body in the vertical direction in which a space charge zone forms when the nominal reverse voltage is applied. In particular in a direction toward the second surface, a highly doped semiconductor region, e.g. a highly doped substrate, which can primarily serve as a carrier or low-impedance terminal doping and is not assigned to the electrically active thickness of the semiconductor body can extend between an electrical terminal of the semiconductor and the region of the space charge zone.

Alternatively, the extension can for example also be dimensioned taking account of the profile of an electric field strength along the side surface of the semiconductor body over the depth of the semiconductor body.

In accordance with one embodiment, a thickness of the dielectric at the side surface decreases along the vertical direction from the first surface toward the second surface.

The present disclosure additionally relates to a semiconductor component comprising a semiconductor body having a first surface, a second surface opposite the first surface, and a side surface surrounding the semiconductor body. The semiconductor component additionally comprises an active region comprising a first semiconductor region of a first conductivity type, which is electrically contacted via the first surface, and a second semiconductor region of a second conductivity type, which is electrically contacted via the second surface. The semiconductor component additionally comprises an edge termination region, which is arranged in a lateral direction between the first semiconductor region of the active region and the side surface and comprises a first edge termination structure and a second edge termination structure, the first edge termination structure is arranged in the lateral direction between the second edge termination structure and the side surface and the second edge termination structure extends from the first surface in a vertical direction more deeply into the semiconductor body than the first edge termination structure.

The subdivision of the edge termination region into a first edge termination structure and into a second edge termination structure, which lies further inward with respect to the first edge termination structure and which additionally extends into the semiconductor body more deeply than the first edge termination structure, enables a technically advantageous edge termination which, in view of the first edge termination structure, affords advantages with regard to the reliability, e.g. on account of metal field plates not being necessary, which entail a risk of corrosion under the influence of moisture, and, in view of the second edge termination structure, enables the advantages of a reduced space requirement.

In accordance with one embodiment, the first edge termination structure comprises one or more of the elements field rings, field plates, junction termination extension, JTE, variation of lateral doping, VLD. The JTE or VLD structures extend for example outside a body region formed in the cell zone of a FET or of an IGBT and are more lightly doped than the body region.

In accordance with one embodiment, an extent of the first edge termination structure in the lateral direction lies in a range of 5 μm to 500 μm. In accordance with a further embodiment, the extent of the first edge termination structure for Si components in the lateral direction lies in a range of 50 μm to 300 μm. For SiC-based components, the required extent of the first edge termination structure is significantly smaller and lies e.g. between 5 μm and 80 μm. In accordance with a further embodiment, the extent of the first edge termination structure in the lateral direction lies in a range of at least 50% of the thickness of the semiconductor body. The exact value of the lateral extent of the first edge termination structure can be defined for example taking account of the desired blocking capability of the component.

In accordance with one embodiment, the first edge termination structure is a JTE structure or a VLD structure and comprises a third semiconductor region, wherein a dopant dose of the third semiconductor region along at least 10%, at least 20% or at least 30% of its lateral extent is smaller than a breakdown charge in the semiconductor body divided by the elementary charge. In this case, the lateral extent extends for example perpendicular to an edge of the semiconductor body. The breakdown charge in a semiconductor body formed with silicon is approximately $1.3 \times 10^{12}$ e/cm$^2$, wherein e corresponds to the elementary charge. The value of the breakdown charge is higher approximately by a factor of 10 in the case of SiC.

In accordance with one embodiment, the first edge termination structure is a JTE structure or a VLD structure and comprises a third semiconductor region, wherein a dopant dose of the third semiconductor region along at least 80% of its extent in the lateral direction is less than a dopant dose of the first semiconductor region. In this case, the lateral direction extends for example perpendicular to an edge of the semiconductor body. Consequently, the dopant dose of the third semiconductor region for example along at least 80% of its extent in the lateral direction is less than the dopant dose of the body region of a FET or of an IGBT or else less than the dopant dose of an anode region of a diode. The lower dopant dose of the third semiconductor region in comparison with the first semiconductor region has an advantageous effect for example with regard to the electric field reduction in the edge termination region.

In accordance with one embodiment, the second edge termination structure extends into the semiconductor body from the first surface to at least double the depth, at least five times the depth or at least ten times the depth, of the first edge termination structure. This enables the technical advantage of a reduced space requirement for the edge termination structure in comparison with a planar edge termination based exclusively on the first edge termination structure, e.g. a JTE structure or a VLD structure.

In accordance with one embodiment, the second edge termination structure comprises a fourth semiconductor region of the first conductivity type, which extends into the semiconductor body from the first surface more deeply than the first semiconductor region in the active region. The fourth semiconductor region can be produced for example with a multiplicity of dopant implantations of differing energy, wherein the profiles of the individual implantations overlap in the vertical direction after the implantation as a result of the thermal budget and thus form the fourth semiconductor region that is deeper than the first semiconductor region in the active region. Particularly in the case of SiC-based semiconductor components, the dopants used diffuse only very little, such that in this case the projected ranges of the individual ion implantations are so close together that a continuous doping profile results. Moreover, the fourth semiconductor region can be produced by means of a masked implantation into different planes of an epitaxy deposition interrupted once or a number of times. Alternatively or supplementary, the fourth semiconductor region can be produced by means of a trench, e.g. a gate trench or—in the case of trench-based compensation components—a compensation trench, into which the dopants are implanted for example into the bottom of the trench and are outdiffused toward the front side and toward the rear side after the epitaxial filling of the trench. Alternatively or supplementary, the dopants of the fourth semiconductor region can also be set by means of a deep diffusion of implanted dopants to give the desired dopant profile. The implantations mentioned above can optionally be carried out with the aid of the so-called channeling effect in order to maximize the penetration depth resulting after the implantation for a specific implantation energy and thus to optimize the depth distribution of these dopants. Acceptor atoms or donor atoms are appropriate as dopants, depending on the conductivity type of the fourth semiconductor region. Exemplary acceptor atoms for a semiconductor body formed with silicon are e.g. boron, gallium or aluminum atoms. The comparatively deep formation of the fourth semiconductor region enables the technical advantage of an improved blocking capability of the semiconductor component. This is attributable inter alia to the fact that the maximum of the electric field strength is far below the surface of the semiconductor body, with the result that surface charges on said surface do not influence the breakdown voltage or influence it only slightly.

In accordance with a further embodiment, a plurality of the fourth semiconductor regions are arranged along the lateral direction at a distance from one another. This makes it possible to achieve a gradual field reduction toward the outside. By way of example, a further structure serving for field reduction, such as a JTE structure, for instance, can be arranged between two fourth semiconductor regions that are adjacent in a lateral direction.

In accordance with one embodiment, the fourth semiconductor region extends into the semiconductor body in the vertical direction from the first surface to a depth of 5 µm to 50 µm or else 8 µm to 30 µm. In accordance with a further embodiment, the fourth semiconductor region extends in the vertical direction from the first surface down to a depth of at least 10% of the thickness of the semiconductor body. As a result, the maximum of the electric field strength during off-state operation of the semiconductor component can be positioned into the depth of the semiconductor body. This has an advantageous effect on the voltage blocking strength of the semiconductor component, as explained above.

In accordance with one embodiment, a dimension of the fourth semiconductor region in the lateral direction at the first surface lies in a range of 30 µm to 150 µm. In accordance with a further embodiment, the dimension of the fourth semiconductor region in the lateral direction at the first surface lies in a range of at least 50% of the effective thickness of the semiconductor body. The fourth semiconductor region can enclose the active region at the first surface for example in an uninterrupted manner or else surround it in the form of a juxtaposition of laterally spaced segments.

In accordance with one embodiment, a dopant dose of the fourth semiconductor region lies in a range of 30% to 150%, or else in a range of 50% to 100%, of a breakdown charge in the semiconductor body. The breakdown charge in a semiconductor body formed with silicon is approximately $1.3 \times 10^{12}$ e/cm$^2$, wherein e corresponds to the elementary charge. The dopant dose corresponds to the integral of the dopant concentration of the fourth semiconductor region along the vertical extension thereof. The vertical extension of the fourth semiconductor region proceeds for example from the first surface of the semiconductor body and ends in the semiconductor body at the deepest point of the fourth semiconductor region relative to the first surface. The fourth semiconductor region can for example also extend into the semiconductor body from below the first surface.

In accordance with one embodiment, a maximum of a dopant concentration in the fourth semiconductor region along the vertical direction lies in a range of 30% to 70% or else of 45% to 55% of a penetration depth of the fourth semiconductor region into the semiconductor body. The maximum can be established for example by setting the implantation energy in the case of a single implantation or else coordinating implantation energies and doses in the case of a plurality of implantations.

In accordance with a further embodiment, a maximum of a dopant concentration in the fourth semiconductor region in the vertical direction lies in a range of 0% to 10% of a penetration depth of the fourth semiconductor region into the semiconductor body. The maximum can be established for example by setting the implantation energy in the case of a single implantation or else coordinating implantation energies and doses in the case of a plurality of implantations.

In accordance with one embodiment, the semiconductor component is a vertical power semiconductor component suitable for conducting a load current of more than 1 A between a first load terminal at the first surface and a second load terminal at the second surface.

In accordance with one embodiment, the semiconductor component is a vertical power semiconductor component suitable for blocking a voltage of more than 500 V between a first load terminal at the first surface and a second load terminal at the second surface. The semiconductor component is configured for example as a power semiconductor diode or as a power semiconductor FET, or as a thyristor (e.g. SCR, silicon controlled rectifier) or else a power semiconductor IGBT. The voltage blocking strength specified in the data sheet of the semiconductor component can be for example 650 V, 1.2 kV, 1.7 kV, 3.3 kV, 4.5 kV, 5.5 kV, 6 kV, 6.5 kV.

BRIEF DESCRIPTION OF THE FIGURES

The accompanying drawings serve to afford an understanding of exemplary embodiments of the invention, are included in the disclosure and form part thereof. The drawings merely illustrate exemplary embodiments and serve together with the description to elucidate same. Further exemplary embodiments and numerous advantages from among those intended are directly evident from the following detailed description. The elements and structures shown in the drawings are not necessarily illustrated in a manner true to scale with respect to one another. Identical reference signs refer to identical or mutually corresponding elements and structures.

FIG. 1 is a schematic cross-sectional view of a semiconductor body of a semiconductor component comprising an active region and an edge termination region, wherein a first edge termination structure and a comparatively deeper second edge termination structure are formed in the edge termination region.

FIG. 2A is a schematic cross-sectional view of the semiconductor body from FIG. 1 with a first edge termination structure formed as a JTE structure.

FIG. 3D is a schematic cross-sectional view of the semiconductor body from FIG. 1 with a second edge termination structure comprising a dielectric formed at a side surface of the semiconductor body.

FIG. 3E is a schematic cross-sectional view of the semiconductor body from FIG. 3D in which the dielectric at the side surface has a thickness that decreases with increasing distance from the first surface.

FIG. 3F is a schematic cross-sectional view of the semiconductor body from FIG. 3D with a semiconductor region which is depletable of free charge carriers and which adjoins the dielectric at the side surface of the semiconductor body.

FIGS. 4A to 4F are schematic cross-sectional views of a semiconductor wafer for elucidating a method for producing a semiconductor component as shown in FIG. 3D, for example, with a dielectric at the side surface.

DETAILED DESCRIPTION

Figure 2B:
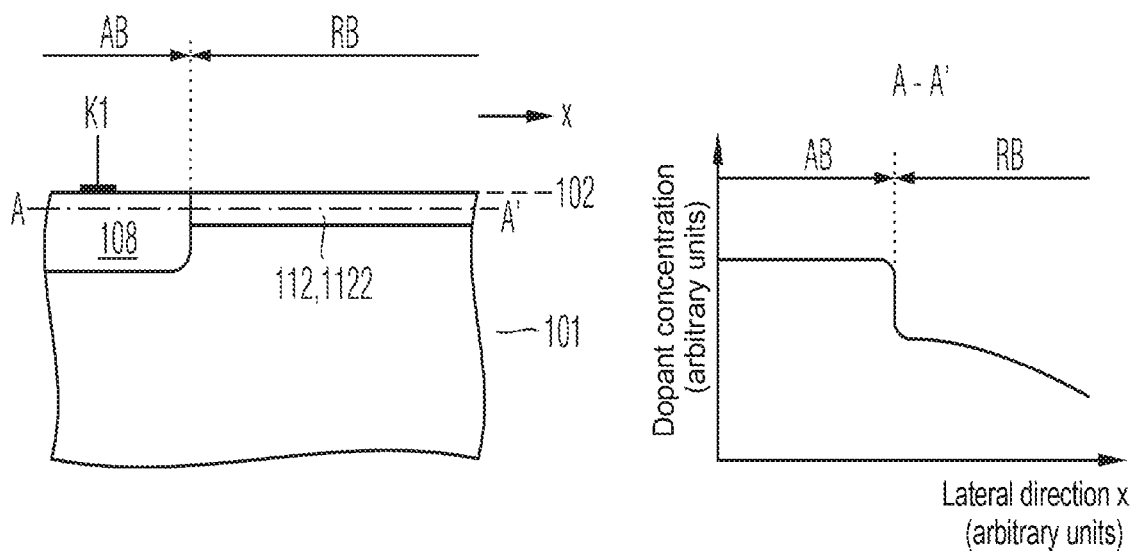
FIG. 2B is a schematic cross-sectional view of the semiconductor body from FIG. 1 with a first edge termination structure formed as a VLD structure.

In the following detailed description, reference is made to the accompanying drawings, which form part of the disclosure and show specific exemplary embodiments for illustration purposes. In this context, a direction terminology such as "upper side", "bottom", "front side", "rear side", "at the front", "at the back", etc. is related to the orientation of the figures currently being described. Since the component parts of the exemplary embodiments can be positioned in different orientations, the direction terminology serves only for elucidation and should in no way be interpreted as limiting.

It goes without saying that further exemplary embodiments exist and structural or logical changes can be made to the exemplary embodiments, without departing in the process from what is defined by the patent claims. The description of the exemplary embodiments is non-limiting in this respect. In particular, elements from exemplary embodiments described below can be combined with elements from other exemplary embodiments from among those described, unless something different is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something different is unambiguously evident from the context.

The terms "have", "contain", "encompass", "comprise" and similar terms are open terms, and the terms indicate the presence of the stated structures, elements or features, but do not exclude additional elements or features. The indefinite articles and the definite articles are intended to encompass both the plural and the singular, unless something different is clearly evident from the context.

The term "electrically connected" describes a permanent low-impedance connection between electrically connected elements, for example a direct contact between the relevant elements or a low-impedance connection via a metal and/or a highly doped semiconductor. The term "electrically coupled" encompasses the fact that one or more intervening elements suitable for signal transmission can be present between the electrically coupled elements, for example elements which are controllable in order to provide at times a low-impedance connection in a first state and a high-impedance electrical decoupling in a second state.

The semiconductor regions can be of a first or of a second conductivity type. In this case, the first (second) conductivity type can be a p-type (n-type) or the first (second) conductivity type can be an n-type (p-type).

FIG. 1 illustrates a semiconductor component 100 in a schematic cross-sectional view.

The semiconductor component 100 comprises a semiconductor body 101 having a first surface 102, a second surface 104 opposite the first surface 102, and a side surface 106 surrounding the semiconductor body 101. The semiconductor component 100 additionally comprises an active region AB comprising a first semiconductor region 108 of a first conductivity type, e.g. p-type, which is electrically contacted via the first surface 102, cf. e.g. the first contact K1 illustrated schematically in FIG. 1, which first contact can consist of one or a multiplicity of conductive materials formed in a wiring region formed above the first surface 102. The semiconductor component 100 additionally comprises a second semiconductor region 110 of a second conductivity type, e.g. n-type, which is electrically coupled to the second surface, cf. e.g. the second contact K2 illustrated schematically in FIG. 1, which second contact can consist of one or a multiplicity of conductive materials formed in a wiring region formed above the first surface. The first semiconductor region can be for example a body region of a field effect transistor (FET) or insulated gate bipolar transistor (IGBT) or else an anode or cathode region of a diode or a thyristor. The second semiconductor region can be for example a drift zone of a FET or of an IGBT or else a cathode or anode region, respectively, of a diode.

The semiconductor body 101 can be based on various semiconductor materials, such as, for instance, silicon, silicon-on-insulator (SOI), silicon-on-sapphire (SOS), silicon-germanium, germanium, gallium arsenide, silicon carbide, gallium nitride, or else further compound semiconductor materials. The semiconductor body can be based on a semiconductor substrate such as a semiconductor wafer, for instance, and comprise one or more epitaxial layers deposited thereon or else be thinned back.

Besides the semiconductor regions illustrated, a multiplicity of further semiconductor regions can be formed in the semiconductor body 101 depending on the type of semiconductor component 100, e.g. source regions, drain regions, field stop zones, highly doped contact terminal regions, etc. Regions of this type are not illustrated in the simplified cross-sectional view in FIG. 1, which is not restricted to a semiconductor component of a specific type.

The semiconductor component 100 additionally comprises an edge termination region RB, which is arranged in a lateral direction x between the first semiconductor region 108 of the active region AB and the side surface 106 and comprises a first edge termination structure 112 in a first region 113 illustrated in a dashed manner, and also a second edge termination structure 114 in a dash-dotted region 115, wherein the second edge termination structure 114 is arranged in the lateral direction x between the first edge termination structure 112 and the side surface 106 and extends into the semiconductor body 101 from the first surface 102 in a vertical direction z more deeply than the first edge termination structure 112. The extension depths of the first and second edge termination structures are identified by t1 and t2 in a simplified manner in FIG. 1, such that the relation t2>t1 holds true. In the schematic cross-sectional view in FIG. 1, by way of example, the extension depth t1 of the first edge termination structure 112 is illustrated as less than an extension depth t3 of the first semiconductor region 108. It goes without saying that the extension depth t3 of the first semiconductor region 108 can also be greater than the extension depth t1 of the first edge termination structure 112.

In accordance with one embodiment, an extent l1 of the first edge termination structure 112 in the lateral direction x lies in a range of 5 μm to 500 μm. In accordance with a further embodiment, the extent l1 of the first edge termination structure 112 in the lateral direction x lies in a range of 50 μm to 300 μm.

In accordance with a further embodiment, the extent l1 of the first edge termination structure in the lateral direction x lies in a range of at least 50% of an electrically active thickness or effective thickness of the semiconductor body dd.

The exact value of the lateral extent of the first edge termination structure can be defined for example taking account of the desired blocking capability of the component 100.

The first edge termination structure 112 can be constructed from one or a plurality of edge termination elements.

The schematic cross-sectional view in FIG. 2A illustrates the first edge termination structure 112 for example as a JTE structure. An exemplary dopant concentration profile along the line AA', i.e. along the lateral direction x through the first semiconductor region 108 and through a third semiconductor region 1121 of the first edge termination structure 112, is shown in the right-hand part of FIG. 2A. In this case, the dopant concentration decreases from the level in the first semiconductor region 108 to the comparatively lower dopant concentration in the third semiconductor region 1121 of the JTE structure.

The schematic cross-sectional view in FIG. 2B illustrates the first edge termination structure 112 for example as a VLD structure. An exemplary dopant concentration profile along the line AA', i.e. along the lateral direction x through the first semiconductor region 108 and through a third semiconductor region 1122 of the first edge termination structure 112, is shown in the right-hand part of FIG. 2B. In this case, the dopant concentration decreases from the level in the first semiconductor region 108 to the comparatively lower dopant concentration of the third semiconductor region 1122 of the VLD structure. Within the VLD structure, the dopant concentration decreases along the lateral direction in the third semiconductor region 1122 toward the outside, i.e. in the direction toward the side surface 106. Alternatively, an outwardly decreasing dopant dose within the VLD structure can also be achieved for example by virtue of the extension depth of the VLD structure decreasing toward the outside.

In accordance with one exemplary embodiment, a dopant dose of the third semiconductor region 1121, 1122 along at least 30% of its extent in the lateral direction x is set such that it is less than a breakdown charge in the semiconductor body 101 divided by the elementary charge e.

In accordance with one exemplary embodiment, a dopant dose of the third semiconductor region along at least 80% of its extent in the lateral direction x is less than a dopant dose of the first semiconductor region 108. The lower dopant dose of the third semiconductor region 1121, 1122 in comparison with the first semiconductor region 108 has an advantageous effect for example with regard to the electric field reduction in the edge termination region RB.

Figure 2C:
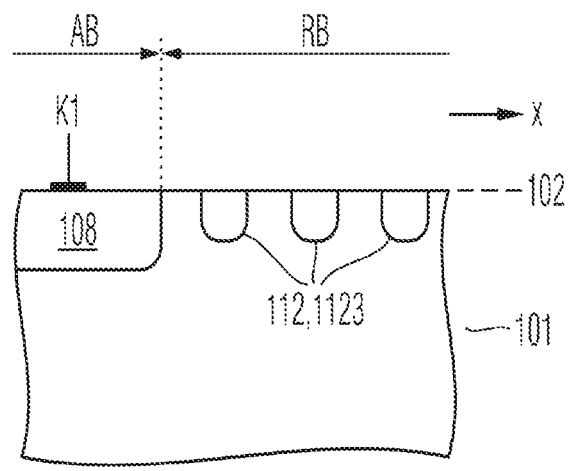
FIG. 2C is a schematic cross-sectional view of the semiconductor body from FIG. 1 with a first edge termination structure formed with field rings or floating potential rings.

The schematic cross-sectional view in FIG. 2C illustrates the first edge termination structure 112 for example as a structure 1123 having field rings or floating potential rings.

Figure 3A:
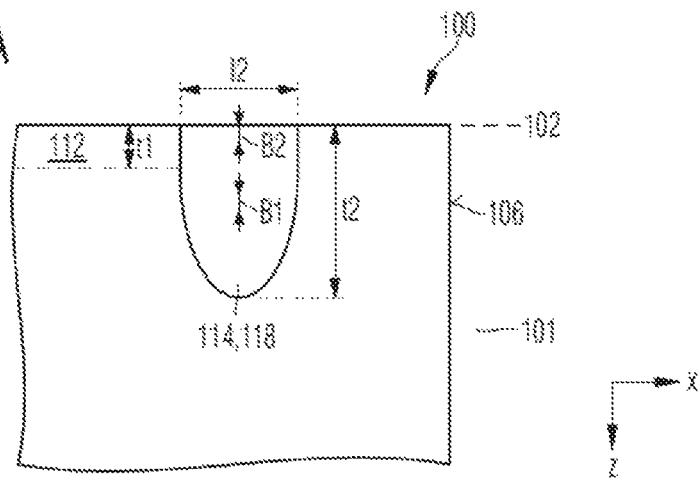
FIG. 3A is a schematic cross-sectional view of the semiconductor body from FIG. 1 with a second edge termination structure formed as a deep semiconductor region.

The schematic cross-sectional view in FIG. 3A illustrates the second edge termination structure 114 for example as a fourth semiconductor region 118.

In accordance with one exemplary embodiment, the fourth semiconductor region 118 of the second edge termination structure 114 extends into the semiconductor body 101 from the first surface 102 at least to double the depth of the first edge termination structure 112, i.e. t2>2×t1. Moreover, the fourth semiconductor region 118 can extend into the semiconductor body 110 from the first surface 102 more deeply than the first semiconductor region 108 in the active region AB.

The extension depth t2 of the fourth semiconductor region into the semiconductor body 101 from the first surface 102 is for example 5 μm to 50 μm or else 8 μm to 30 μm. In the case of SiC-based components, the extension depth t2 is typically between 2 μm and 20 μm or between 3 μm and 10 μm. In accordance with a further embodiment, the extension depth t2 of the fourth semiconductor region into the semiconductor body 101 from the first surface 102 is at least 10% of the effective thickness of the semiconductor body dd. This makes it possible to keep the maximum of the electric field strength during off-state operation of the semiconductor component away from the first surface 102 and deep in the semiconductor body 101. This has an advantageous effect on the voltage blocking strength of the semiconductor component, as explained above.

Figure 3B:
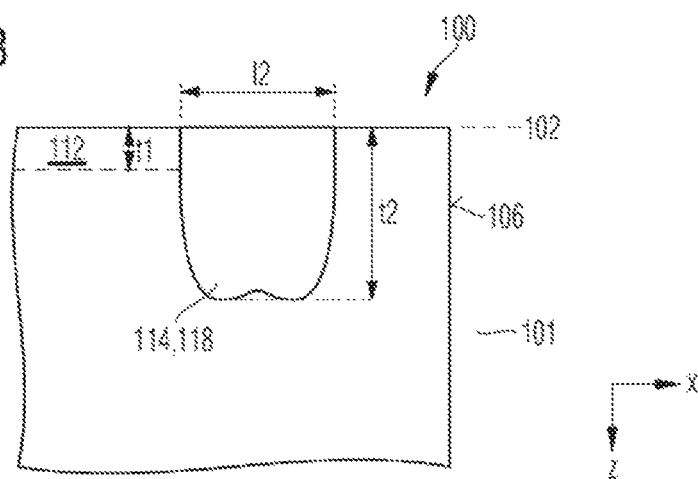
FIG. 3B is a schematic cross-sectional view of the semiconductor body from FIG. 1 with a second edge termination structure having laterally overlapping deep semiconductor regions.
Figure 3C:
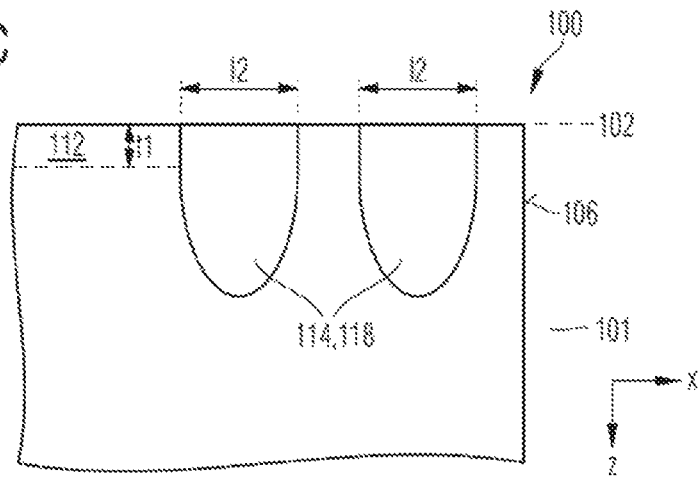
FIG. 3C is a schematic cross-sectional view of the semiconductor body from FIG. 1 with a second edge termination structure having laterally spaced deep semiconductor regions.

As is illustrated in the schematic cross-sectional views in FIGS. 3B and 3C, a plurality of the fourth semiconductor regions 118 can be arranged in a laterally overlapping manner (cf. FIG. 3B) or else in a laterally spaced manner (cf. FIG. 3C). In the case of the lateral spacing shown in FIG. 3C, further edge termination elements, e.g. VLD or JTE structures, can be arranged between adjacent fourth semiconductor regions.

A dimension l2 of the fourth semiconductor region 118 in the lateral direction x at the first surface lies for example in a range of 30 μm to 150 μm. In accordance with a further embodiment, the dimension l2 of the fourth semiconductor region 118 in the lateral direction x at the first surface lies for example in a range of at least 50% of the effective thickness of the semiconductor body dd.

A dopant dose of the fourth semiconductor region 118 lies for example in a range of 30% to 150% of a breakdown charge in the semiconductor body divided by the elementary charge e.

As described further above, the fourth semiconductor region 118 can be produced in diverse ways. This makes it possible to place a dopant maximum of this region along the vertical direction z at different positions in order thus to optimize the electric field profile during off-state operation within the edge termination region RB. By way of example, a maximum of a dopant concentration in the fourth semiconductor region 118 along the vertical direction z lies in a first range B1 of 45% to 55% of a penetration depth of the fourth semiconductor region 118 into the semiconductor body 101 (cf. FIG. 3A). In accordance with a further configuration, the maximum of a dopant concentration in the fourth semiconductor region in the vertical direction lies in a second range B2 of 0% to 10% of a penetration depth of the fourth semiconductor region 118 into the semiconductor body 101.

In the schematic cross-sectional view in FIG. 3D, the second edge termination structure 114 is formed for example as a dielectric 120, which adjoins the first side surface 106 and extends along the vertical direction z of at least one part of the side surface 106. The dielectric 120 is for example a dielectric of high quality such as, for instance, a dielectric composed of inorganic materials such as $SiO_2$, $Si_3N_4$ or similar materials. A further dielectric 121 can be formed on the first surface 102, too, which further dielectric can correspond to or else deviate from the dielectric 120 at the side surface 106 with regard to the material composition. This makes it possible to achieve the technical advantage of a better tolerance vis-à-vis an electric field line concentration at the corner E. By way of example, a thickness d of the dielectric 120 at the first surface 102 lies in a range of 100 nm to 10 μm. The further dielectric 121 at the first surface 102 can be fabricated for example by processes that are used elsewhere to produce a dielectric in the course of the method for producing the semiconductor component 100, e.g. a LOCOS (Local oxidation of silicon) process for defining a cell region in the active region AB.

Although the dielectric 120 adjoining the side surface 106 can extend from the first surface 102 as far as the second surface, an extension that ends above the second surface 104, as shown in FIG. 3D, for instance, is likewise suitable for improving the blocking strength of the component. Since the highest potential difference with respect to the second surface 104, which can be applied on a leadframe, occurs near the first surface 102, the dielectric 120 should be made sufficiently thick and with sufficient quality in the upper and uppermost region.

By way of example, the dielectric 120 extends at the side surface 106 along the vertical direction z from the first surface 102 as far as at least one third of a thickness d0 of the semiconductor body 101. If the vertical extension of the dielectric is designated by t3, then $d0/3 \le t3 \le d0$ holds true, for example. By way of example, the vertical extension of the dielectric 120 proceeding from the first surface 102 can be dimensioned such that the dielectric 120 covers a depth range at the side surface 106 in which electric field strengths in the insulator surrounding the dielectric 120 above a threshold value, e.g. 100 kV/cm, can occur. Moreover, the dielectric 120 can extend at the side surface 106 as far as a depth of the semiconductor body 101 at which a functional semiconductor layer, e.g. a field stop layer, is formed in the semiconductor body 101.

The schematic cross-sectional view in FIG. 3D illustrates the dielectric 120 at the side surface 106 for example with a constant thickness. As is illustrated in the schematic cross-sectional view in FIG. 3E, a thickness dl of the dielectric 120 at the side surface 106 can also decrease along the vertical direction z from the first surface 102 toward the second surface, since the potential differences during off-state operation of the component decrease from the first surface 102 toward the second surface 104 and the requirements made of the dielectric strength of the dielectric 120 thus likewise decrease with increasing distance from the first surface 102. By way of example, the thickness dl decreases in a stepped fashion, cf. outer edge 1201 in FIG. 3E, or else linearly, cf. outer edge 1202 in FIG. 3E. It goes without saying that a thickness profile of the dielectric 120 at the side surface 106 which decreases toward the second surface 104 can also deviate from the profiles shown by way of example.

In the schematic cross-sectional view in FIG. 3F, the semiconductor component 100 comprises a fifth semiconductor region 122 of the first conductivity type, which adjoins the dielectric 120 at the side surface 106. The fifth semiconductor region 122 can be configured for example such that it partly or completely covers the dielectric 120 at the side surface 106. By way of example, the fifth semiconductor region 122 is configured with regard to the dimensions and dopant concentration such that it is depletable of free charge carriers during off-state operation of the semiconductor component 100. The formation of the fifth semiconductor region 122 makes it possible to reduce the influence of fixed charges in the dielectric on the blocking ability of the semiconductor component 100 and thus contributes to an improvement in reliability.

A method for producing a semiconductor component 100 comprising a dielectric 120 as shown by way of example in FIG. 3D is elucidated in the schematic cross-sectional views in FIGS. 4A to 4F.

Referring to the cross-sectional view in FIG. 4A, a semiconductor wafer 1011 with a mask layer 124, e.g. a hard or resist mask, on the first surface 102 is provided.

Referring to the cross-sectional view in FIG. 4B, a trench 126 is formed from the first surface 102 in the semiconductor wafer 1011, e.g. by means of an etching process such as a dry etching process with prior photolithographic patterning of the mask layer 124. The trench 126 lies for example between a kerf region SB and the edge termination region RB.

Figure 4C:
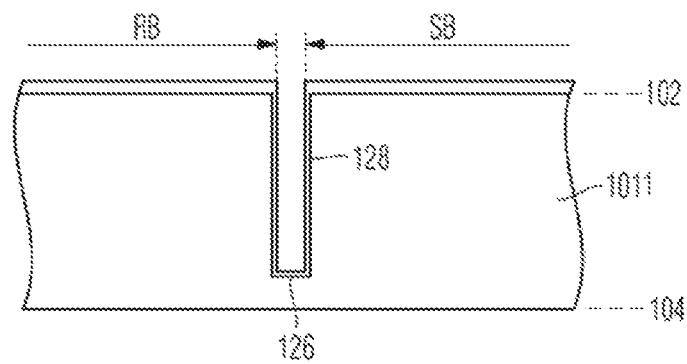
Figure 4D:
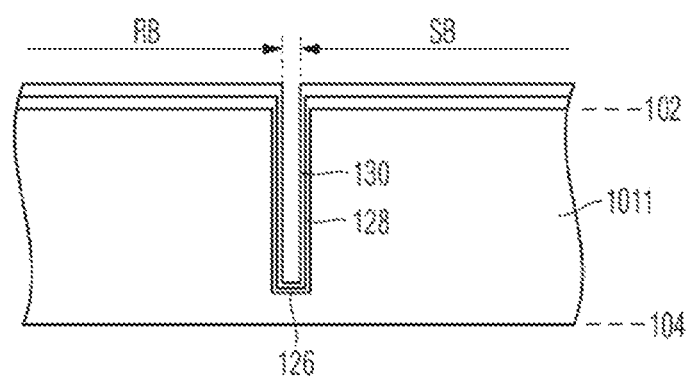

Referring to the cross-sectional views in FIGS. 4C, 4D, the trench is lined with a first dielectric 128 and a second dielectric 130. It is possible to dispense with forming the first dielectric 128 and/or the second dielectric 130 provided that filling the trench with a dielectric satisfies requirements in respect of quality and reliability which are made of the dielectric 120 in FIG. 3D. By way of example, the first dielectric 128 is formed as a thermal oxide in order to achieve an interface of high quality toward the semiconductor body 101. The second dielectric can be a nitride, for example.

Figure 4E:
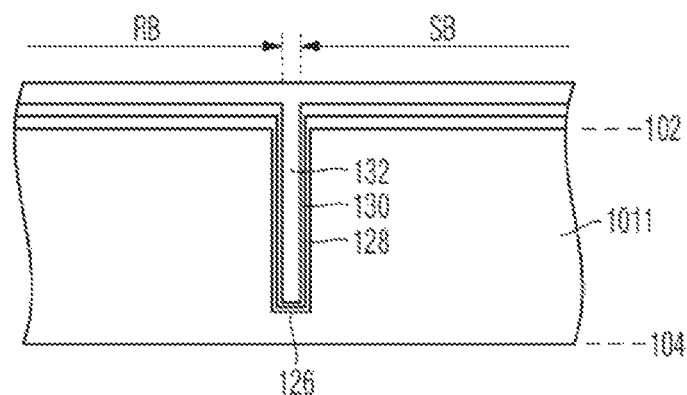

Referring to the cross-sectional view in FIG. 4E, the trench is filled with a third dielectric 132, e.g. an oxide such as SiO2, BPSG (borophosphosilicate glass), PSG (phosphosilicate glass) or some other dielectric such as, for instance, a nitride, a low-k or high-k dielectric. The dielectrics can be produced by suitable production methods such as, for instance, chemical vapor deposition (CVD), plasma-enhanced CVD (PECVD) or else low-pressure CVD (LPCVD).

Figure 4F:
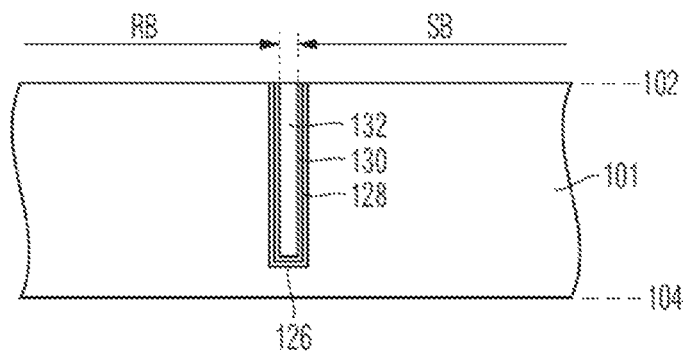

Referring to the cross-sectional view in FIG. 4F, the dielectrics 128, 130, 132 are removed again on the first surface 102, e.g. by means of an etching and/or polishing process such as chemical mechanical polishing (CMP).

Dividing the semiconductor wafer 1011 in the kerf region SB by means of a suitable separating process such as e.g. sawing or laser cutting can then follow in such a way that the wafer 1011 is divided such that the cut edge in the kerf region extends as far as or into the dielectrics 128, 130, 132, such that after dividing the side surfaces of the semiconductor bodies are at least partly covered with a dielectric, and a structure as shown for example in FIG. 3D results.

Figure 5:
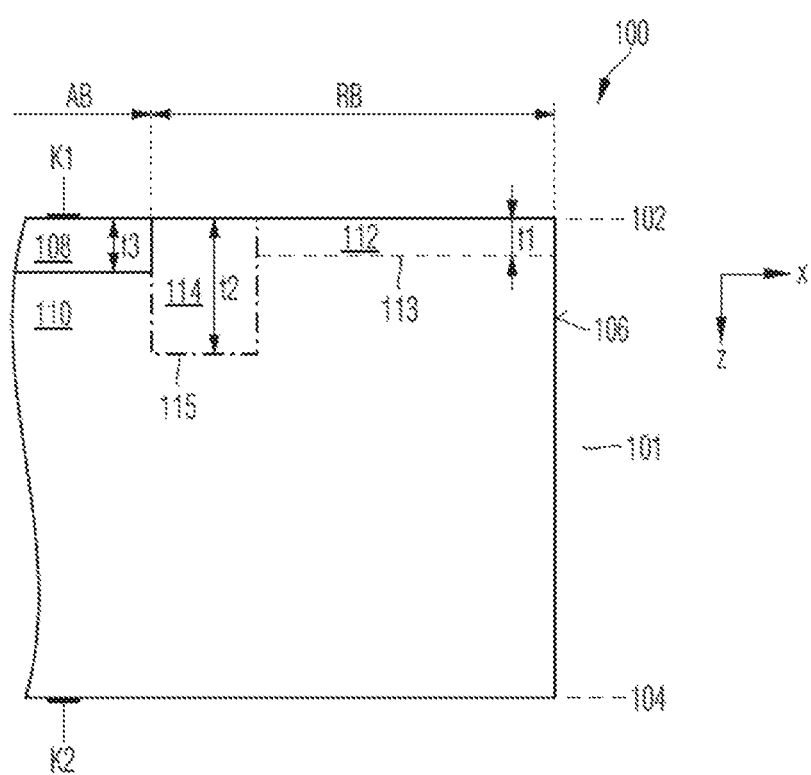
FIG. 5 is a schematic cross-sectional view of a semiconductor body of a semiconductor component comprising an active region and an edge termination region comprising a first edge termination structure and a comparatively deeper second edge termination structure, which are arranged in an interchanged manner in comparison with the view from FIG. 1.

The schematic cross-sectional view in FIG. 5 shows a semiconductor body of a semiconductor component 100 in which the arrangement of the first edge termination structure 112 and of the comparatively deeper second edge termination structure 114 is opposite to the arrangement of the embodiment from FIG. 1. A space-saving and advantageous edge termination region can be fashioned with this arrangement, too. The indications given in association with FIGS. 1 to 3C can be applied to the semiconductor component in FIG. 5.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

The invention claimed is:
1. A semiconductor component, comprising:
a semiconductor body having a first surface, a second surface opposite the first surface, and a side surface surrounding the semiconductor body;
an active region comprising a first semiconductor region of a first conductivity type, which is electrically contacted via the first surface, and a second semiconductor region of a second conductivity type, which is electrically contacted via the second surface;

an edge termination region arranged in a lateral direction between the first semiconductor region of the active region and the side surface, and comprising a first edge termination structure and a second edge termination structure, wherein the second edge termination structure comprises a fourth semiconductor region extending into the semiconductor body from the first surface in a vertical direction at least to double the depth of the first edge termination structure, and wherein a bottom of the fourth semiconductor region is vertically separated from the second surface of the semiconductor body.

2. The semiconductor component of claim 1, wherein the first edge termination structure comprises one or more of field rings, field plates, junction termination extension (JTE), and/or variation of lateral doping (VLD).

3. The semiconductor component of claim 1, wherein an extent of the first edge termination structure in the lateral direction lies in a range of at least 50% of an electrically active thickness of the semiconductor body.

4. The semiconductor component of claim 1, wherein the first edge termination structure is a JTE structure or a VLD structure and comprises a third semiconductor region of the first conductivity type, and wherein a dopant dose of the third semiconductor region along at least 10% of its extent in the lateral direction is less than a breakdown charge in the semiconductor body.

5. The semiconductor component of claim 1, wherein the first edge termination structure is a JTE structure or a VLD structure and comprises a third semiconductor region, and wherein a dopant dose of the third semiconductor region along at least 80% of its extent in the lateral direction is less than a dopant dose of the first semiconductor region.

6. The semiconductor component of claim 1, wherein a plurality of the fourth regions is arranged along the lateral direction at a distance from one another or in a manner overlapping one another.

7. The semiconductor component of claim 1, wherein the fourth semiconductor region extends into the semiconductor body in the vertical direction from the first surface to a depth of at least 10% of an effective thickness of the semiconductor body.

8. The semiconductor component of claim 1, wherein a dimension of the fourth semiconductor region in the lateral direction at the first surface lies in a range of 3 µm to 300 µm.

9. The semiconductor component of claim 1, wherein a dopant dose of the fourth semiconductor region lies in a range of 30% to 150% of a breakdown charge in the semiconductor body.

10. The semiconductor component of claim 1, wherein a maximum of a dopant concentration in the fourth semiconductor region along the vertical direction lies in a range of 30% to 70% of a penetration depth of the fourth semiconductor region into the semiconductor body.

11. The semiconductor component of claim 1, wherein a maximum of a dopant concentration in the fourth semiconductor region in the vertical direction lies in a range of 0% to 10% of a penetration depth of the fourth semiconductor region into the semiconductor body.

12. The semiconductor component of claim 1, wherein the first edge termination structure is arranged in the lateral direction between the second edge termination structure and the side surface.

13. The semiconductor component of claim 1, wherein the second edge termination structure is arranged in the lateral direction between the first edge termination structure and the side surface.

14. The semiconductor component of claim 1, wherein the semiconductor component is a vertical power semiconductor component configured to conduct a load current of more than 1 A between a first load terminal at the first surface and a second load terminal at the second surface.

15. The semiconductor component of claim 1, wherein the semiconductor component is a vertical power semiconductor component suitable for blocking a voltage of more than 500 V between a first load terminal at the first surface and a second load terminal at the second surface.

16. The semiconductor component of claim 1, wherein the bottom of the fourth semiconductor region is vertically separated from the second surface of the semiconductor body by a region of the semiconductor body which has the second conductivity type.

17. The semiconductor component of claim 1, wherein the fourth semiconductor region is laterally separated from the side surface by a region of the semiconductor body which has the second conductivity type.

18. The semiconductor component of claim 1, wherein the first edge termination structure comprises a junction termination extension (JTE) region, wherein the JTE region has a dopant concentration that is below that of the first semiconductor region throughout the JTE region and is substantially constant across a lateral width of the JTE region.

19. The semiconductor component of claim 1, wherein the first edge termination structure comprises a variation of lateral doping (VLD) structure, wherein the VLD structure has a dopant concentration that is below that of the first semiconductor region throughout the VLD structure and decreases laterally moving from the first semiconductor region towards the fourth semiconductor region.

* * * * *

UNITED STATES PATENT AND TRADEMARK OFFICE
CERTIFICATE OF CORRECTION

PATENT NO. : 11,018,249 B2
APPLICATION NO. : 16/263244
DATED : May 25, 2021
INVENTOR(S) : A. Mauder et al.

It is certified that error appears in the above-identified patent and that said Letters Patent is hereby corrected as shown below:

In the Claims

Column 14, Line 46 (Claim 19, Line 2), please change "of" to -- of a --.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*